(12) United States Patent
Dijon (10) Patent No.: US 9,165,825 B2
(45) Date of Patent: Oct. 20, 2015

(54) INTERCONNECTION STRUCTURE MADE OF REDIRECTED CARBON NANOTUBES

(71) Applicant: Jean Dijon, Champagnier (FR)

(72) Inventor: Jean Dijon, Champagnier (FR)

(73) Assignee: Commissariat A L'Energie Atomique Et Aux Energies Alternatives, Paris (FR)

( * ) Notice: Subject to any disclaimer, the term of this patent is extended or adjusted under 35 U.S.C. 154(b) by 0 days.

(21) Appl. No.: 14/317,708

(22) Filed: Jun. 27, 2014

(65) Prior Publication Data

US 2014/0338189 A1  Nov. 20, 2014

Related U.S. Application Data

(62) Division of application No. 13/575,371, filed as application No. PCT/FR2010/052792 on Dec. 17, 2010, now abandoned.

(30) Foreign Application Priority Data

Feb. 11, 2010 (FR) ...................... 10 50986

(51) Int. Cl.
*H01L 21/4763* (2006.01)
*H01L 21/768* (2006.01)
(Continued)

(52) U.S. Cl.
CPC .... *H01L 21/76841* (2013.01); *H01L 21/76877* (2013.01); *H01L 23/53276* (2013.01); *B82Y 40/00* (2013.01); *H01L 2221/1094* (2013.01); *H01L 2924/0002* (2013.01); *Y10S 977/842* (2013.01); *Y10T 29/49002* (2015.01); *Y10T 29/49117* (2015.01)

(58) Field of Classification Search
CPC ..................... H01L 21/02606; H01L 51/0048; H01L 21/0045; H01L 21/76877; H01L 23/53276; H01L 2924/0002
USPC ............. 257/40, 208; 977/734, 742; 438/618, 438/629
See application file for complete search history.

(56) References Cited

U.S. PATENT DOCUMENTS

2006/0212974 A1* 9/2006 Kawabata et al. ............ 977/742
2008/0042287 A1* 2/2008 Furukawa et al. ............ 257/758
(Continued)

FOREIGN PATENT DOCUMENTS

CN  101562148  10/2009

OTHER PUBLICATIONS

Hayamizu, Y. et al., "Integrated three-dimensional microelectromechanical devices from processable carbon nanotube wafers," *Nature Nanotechnoiogy*, vol. 3, May 2008, pp. 289-294.
(Continued)

*Primary Examiner* — Jarrett Stark
*Assistant Examiner* — Shahed Ahmed
(74) *Attorney, Agent, or Firm* — Burns & Levinson LLP (57) ABSTRACT

The invention relates to an electronic device including electric connections extending along at least two different directions, said connections being essentially formed by means of bundles of carbon nanotubes (CNT) (8), Where at least two CNT bundles comprise a portion (8a) having its axis directed along a first direction and a portion (8b) having its axis redirected along a second direction, the connections between CNT bundles being achieved by overlapping of the portions (8b) of said at least two bundles to form a connection line (4).

11 Claims, 6 Drawing Sheets

(51) Int. Cl.
  *H01L 23/532* (2006.01)
  *B82Y 40/00* (2011.01)

(56) References Cited

U.S. PATENT DOCUMENTS

2009/0294966 A1    12/2009  Liu et al.
2013/0109170 A1*   5/2013   Awano et al. ............... 438/622

OTHER PUBLICATIONS

Katagiri, M. et al., Fabrication of 70-nm-diameter carbon nanotube via interconnects by remote plasma-enhanced chemical vapor deposition and their electrical properties. IEEE Interconnect Technology Conference Jun. 1-3, 2009, pp. 44-46.

Yokoyama, D. et al., "Electrical Properties of Carbon Nanotubes Grown at a Low Temperature for Use as Interconnects," *Jap. J. Appl. Phys.*, 47(4), 2008, pp. 1985-1990.

Dijon, J. et al., "Carbon nanotubes for interconnects in future integrated circuits: The challenge of the density," *Diam. Relat. Mater.*, (2009), doi:10.1016/j.diamond.2009 11.017, pp. 1-7.

International Search Report dated May 2, 2011 for PCT/FR2010/052792 filed on Dec. 17, 2010, entitled, "Interconnection Structure Made of Redirected Carbon Nanotubes,".

* cited by examiner

INTERCONNECTION STRUCTURE MADE OF REDIRECTED CARBON NANOTUBES

CROSS-REFERENCE TO RELATED APPLICATIONS

This application claims priority under 35 U.S.C. §§120 and 121 as a divisional patent application of U.S. patent application Ser. No. 13/575,371, filed on Jul. 26, 2012, which application is a U.S. national stage application under 35 U.S.C. §371 of International Application No. PCT/FR2010/052792, filed on Dec. 17, 2010, and entitled, "INTERCONNECTION STRUCTURE MADE OF REDIRECTED CARBON NANOTUBES," which in turn claims priority to and the benefit of French Patent Application No, 1050986, filed on Feb. 11, 2010, Each of the aforementioned patent applications is incorporated by reference herein in their entirety for all purposes.

TECHNICAL FIELD

The present disclosure relates to an electronic device comprising electric connections formed by means of carbon nanotubes (CNT), It also relates to methods for forming such connections.

This invention especially has applications for thermal, electric, and mechanical connectors.

BACKGROUND OF THE INVENTION

The use of carbon nanotubes (CNT) or of CNT bundles to manufacture through vias or chip interconnects has already been provided, especially to provide a complement or even an alternative to the use of copper. Indeed, the latter is not adapted when minute sizes are involved. CNTs further have the necessary properties, such as a low electric resistance, enabling to provide the best electric conductivity between the different chip levels, A via is a cavity enabling to create a connection between conductive plates. The electric lines formed on the plates create the connection between vias, Conductive plates are made of a metal, such as aluminum, and are separated by an insulating layer having the cavity forming the via dug therein.

The miniaturization of electronic devices makes the use of copper quite problematic since copper causes difficulties due to eleetromigration when current densities become too high. Architectures formed of copper lines and vias thus show their limits in integrated circuits having a resolution close to 22 nanometers.

Figure 1:
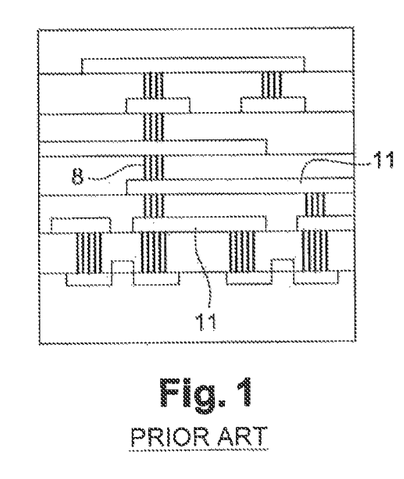
FIG. 1 shows a diagram illustrating the integration of carbon nanotubes (CNT) in prior art ULSI ("Ultra Large Scale Integration") interconnects.
Figure 2:
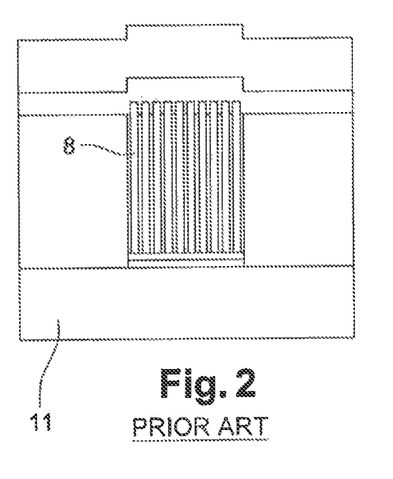
FIG. 2 is a diagram illustrating prior art, that is, the growth of carbon nanotubes (CNT) in vias, creating a contact with the copper cables.

As illustrated in FIGS. 1 and 2, the use of CNTs for ensuring the connection between conductive tracks has been provided, by replacing copper or tungsten vias with CNTs (Katagiri et al., Interconnect Technology Conference, 2009,IEEE International 1-3 Jun. 2009,pp. 44-46; Yokoyama et al. Japanese Journal of Applied Physics, Vol. 47, No 4, 2008,pp. 1985-1990). However, this method does not enable to totally do away with copper, the connection between vias being always ensured by a copper line. Electromigration-related issues are thus not totally suppressed.

Document US 2008/0042287 describes an electronic device in which the connections are at least partially ensured by CNT bundles. The via is covered with a layer of conductive material on which another CNT bundle can be deposited and directed along the line direction. However, the vias and the lines are not formed from the same CNT bundle.

Document US 2006/0212974 discloses an electronic device comprising CNT bundles prepared inside of the via, and then redirected along another direction to connect two conductive layers of two different levels. There are no connections between vias.

Document CN 101562148 relates to a method for creating vertical CNT connections by deposition of a CNT solution on a conductive layer. In this device, two conductive layers of different levels are connected by means of CNT bundles.

Figure 3:
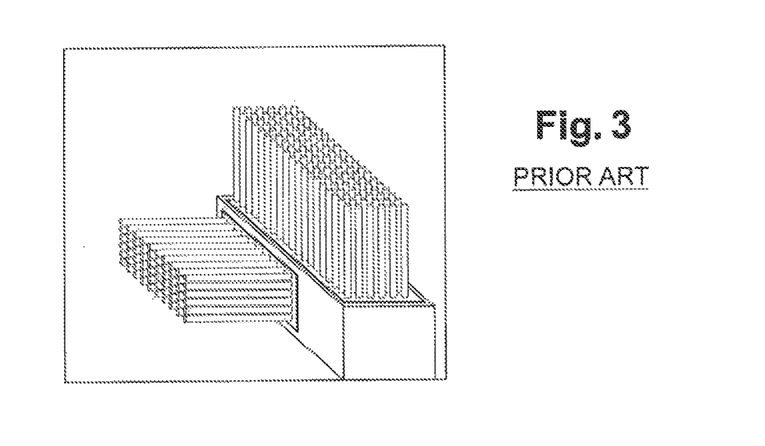
FIG. 3 is a three-dimensional microscope view of a prior art line/via interconnection system, implying a metal contact block.
Figure 4:
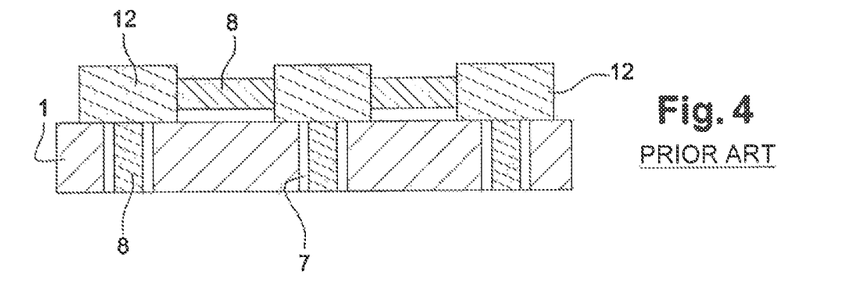
FIG. 4 is a diagram of a prior art line/via interconnection system, implying a metal contact block.

Another technology is based on the same concept of CNT vias, but comprises using metal blocks to change the orientation of the CNTs and thus form the horizontal lines (FIG. 3). It is however difficult to control the deposition of a catalyst and the CNT growth along two perpendicular directions on two surfaces of a metal block (FIG. 4). Another disadvantage of this technique is the repeated crossing of many CNT—metal interfaces to ensure the conduction.

Document US 2009/0294966 describes vertical CNT vias ensuring the electric connection between two conductive layers, but also horizontal CNT lines providing an electric connection between vias. This involves two separate bundles directed along two different directions. The CNT bundles coming from the via do not enable to form the line.

These different approaches imply controlling the CNT growth within smaller and smaller cavities, thus raising the issue of the CNT bundle density. Indeed, just like the homogeneity of their properties and of their orientation, the control of the CNT density is of major importance to provide good electric connections in nanoelectronics. High CNT densities are thus indispensable.

Hata and co-workers (Hayamizu et al, Nature nanotechnology, Vol. 3, 2008, 289-294) have recently revealed an organizing and densifying effect capable of being obtained by dipping of a film of scattered CNTs in an alcohol solution. Indeed, when the CNT film is dipped into the alcohol bath, perpendicularly to the surface thereof, and then dried, the CNTs gather and align. Due to the surface tension of the liquid and to the strong Van der Wools interactions, the CNTs achieve a structure close to that of graphite. No disassembly of the CNTs has been observed after densification. However, Hata only obtains structures formed of CNTs directed along the same direction, which thus limits possible applications.

The present invention comes from the search for technical solutions especially enabling to do away with the use of metals and implementing simple manufacturing processes.

SUMMARY OF THE INVENTION

Thus, the present invention provides a new architecture, enabling to do away with the use of metals to ensure the connection between plates or to ensure the change of direction of a CNT bundle, which is based on the growth and the redirection of carbon nanotubes (CNTs).

Generally, the present invention comprises forming the electric connections, in an electronic device, with bundles of carbon nanotubes (CNT directed along a first direction and contained in cavities called vias. Such CNT bundles are laterally interconnected by lines, also formed of CNT bundles along a second direction.

In the rest of the discussion, terms "via" and "line" are used to designate the CNT bundles contained in the cavities or vias and representing the connection lines, respectively.

Typically, an electronic device according to the present invention comprises a sequence of structures especially made of a conductive plate (for example, made of aluminum) covered with an insulator layer (silica or low-K microelectronics material). Cavities interconnected by lines are dug into the insulating block to create interconnects between plates (vias) or between vias (lines).

More specifically, the present invention relates to an electronic device comprising electric connections extending along at least two different directions. Typically, said connections are essentially formed by means of bundles of carbon nanotubes (CNT), where at least two CNT bundles comprise a portion having its axis directed along a first direction and a portion having its axis redirected along a second direction. Further, the connection between CNT bundles is achieved by overlapping of the portions of said at least two CNT bundles to form a connection line.

At least two bundles forming the electric connections are bent, an area of the CNT bundles being directed along the first direction and another area being directed along a second different direction.

It should be noted that the electric connection system of the present invention enables to form connections in at least two directions, advantageously vertical and horizontal, but may also be used to create connections in more than two directions, especially three, in particular in the case of two different connections in the horizontal plane.

According to the present invention, the electric connections are mainly formed by means of CNT bundles or bunches, that is, a multitude of aggregated carbon nanotubes having a substantially parallel growth axis. Term "essentially" indicates that the electric connections may be only ensured by the CNTs, and thus in the absence of metal lines or blocks, as used to be the case in prior art. However, and as will described hereafter, the electric contact between bundles may be improved by further performing a metal deposition.

In practice, such electric connections are created by implementing the following method:
  growth of at least one CNT bundle along the first direction;
  redirection of a portion of the CNT bundle along the second direction, advantageously by flowing of a liquid.

Typically, the method for creating electric connections in at least two directions within an electronic device according to the present invention comprises the steps of:
  growing at least two CNT bundles along a first direction in a cavity of said device;
  redirecting a portion of said two CNT bundles along a second direction, advantageously by flowing of a liquid, to form the connection line.

The forming of this device thus comprises the controlled growth of CNT bundles along a first direction within cavities, according to techniques tried and tested in prior art, especially by means of catalysts such as iron.

Typically, the growth of the CNT bundles is stopped when said bundles have a height at least greater than that of the via. A portion of these CNT bundles is then redirected along a second direction, advantageously by flowing of a liquid.

The redirection of the CNT bundle may be performed by the technique described in the Hayamizu et al, document. (Nature nanotechnology, Vol. 3, 2008, 289-294). In practice, it comprises immersing the CNTs in an isopropyl alcohol solution and pulling them parallel to the direction of a groove, the groove being perpendicular to the meniscus of the liquid. This operation also enables to densify the CNT bundles.

According to a privileged embodiment, the portion of the CNT bundle which has been redirected along the second direction is substantially perpendicular to the portion of the CNT bundle along the first direction.

Typically, the first direction is substantially vertical. Advantageously, the portion of the CNT bundle along the first direction forms the via of the electronic device.

Preferentially, the second direction is substantially horizontal. Advantageously, the portion of the CNT bundle along the second direction forms the connection line of the electronic device. In a privileged embodiment, vias and lines are thus substantially perpendicular.

To form connections between vias, in particular, the electronic device according to the present invention preferentially comprises at least two CNT bundles having their portions along the second direction, which may be substantially horizontal, forming the connection line. The line is advantageously formed by overlapping of the portions of the CNT bundles along the second direction, that is, by successive superposition of the bundle ends.

This embodiment is implemented by the following method:
  growth of a plurality of parallel CNT bundles along the first direction, advantageously within vias;
  redirection of a portion of the CNT bundles along the second direction;
  connection, advantageously by overlapping, of the portions of the CNT bundles along the second direction, to form the connection line.

The overlapping is actually obtained by flattening of the upper portion of the CNT bundles, thus only leaving the portion of the CNT bundle contained in the cavity in the first direction, preferably substantially vertically. Advantageously, the second direction, that is, the overlapping direction, is that of a groove previously dug into the insulating block to contain the connection line.

According to a specific embodiment, the device of the present invention further comprises a metal layer. Advantageously, it covers at least the portion of the CNT bundles along the second direction, and more advantageously still the connection line.

This metal layer may enable:
  to uniformize the surface of the device for an encapsulation or to be used as a support to form an upper connection level. In this last case, it is advantageous to deposit a metallic material, for example, aluminum, capable of promoting the growth of a second CNT level; and/or
  promote the connection between vias.

This metal layer is deposited by means of any adapted technique known by those skilled in the art.

According to another embodiment, the electronic device may further comprise another CNT bundle laterally connected to at least one CNT bundle of the device, at the level of its portion in the second direction, to form the line. This other CNT bundle ensures the connection with a bundle coming from a via and possibly between several vias. The connection is achieved after the growth of this other CNT bundle, either directly along the second direction, or after its redirection along the second direction, as described previously.

Preferentially, the other CNT bundle is laterally connected to at least two CNT bundles to ensure the connection between vias.

According to the selected operating mode, the growths of CNT bundles forming either the vias, or the connection lines, may be simultaneous or separate.

Advantageously, the growth of the other CNT bundle is performed within a groove and not within a cavity. The other CNT bundle thus cannot directly come into contact with the conductive plate, since it is physically separated therefrom by the insulating block. The redirection of this other CNT bundle along the second direction may be performed in the groove.

In this specific embodiment, the lateral connection between CNT bundles is advantageously achieved by the deposition of a metal layer. in practice, it is located at the interface of the two types of CNT bundles: at least one CNT bundle, at the level of its portion along the second. direction, coming from the via(s) and the other bundle forming the line.

This layer is advantageously formed by means of a so-called contact metal selected from the following group: palladium, copper, gold, or titanium. Thus, the contact metal ensures the connection between the CNT bundles coming from the vias and the CNT bundle forming the connection line.

In the context of the present invention, to locate CNTs in predetermined growth areas, one may:
- either deposit the growth catalyst over the entire plate, and then remove it (by etching, polishing . . . ) from the non-predetermined areas;
- or deposit TiN on the non-predetermined areas, then deposit the catalyst full wafer, as described in Dijon et al. (Dian. Relat, Mater., 2009,doi:10,1016/j.diamond.2009.11.017).

According to a preferred embodiment, the method for creating electric connections in at least two directions within an electronic device according to the present invention further comprises a step of deposition of at least one metal layer on the portion of the CNT bundles along the second direction.

It may also comprise a step of growth, and possibly of redirection along the second direction, of another CNT bundle intended to laterally connect at least one CNT bundle, at the level of its portion along the second direction, to form the connection line. In this specific case, the method may possibly comprise a step of deposition of a metal layer on the other CNT bundle, Further, the method for forming the device according to the present invention may comprise at least one step of deposition of TIN on the areas where CNTs should not grow.

In electronic devices according to the present invention, the electric current appears to essentially flow through the carbon nanotubes, thus considerably decreasing electromigration problems, Further, methods for forming such devices implement relatively tried and tested techniques.

EMBODIMENTS OF THE INVENTION

The foregoing and other features and advantages of the present invention will be discussed in the following non-limiting description of the following embodiments in connection with the accompanying drawings.

DETAILED DESCRIPTION OF THE INVENTION

Figure 5A:
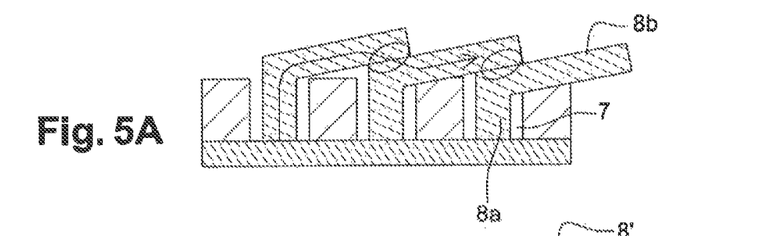
FIG. 5A is a diagram of the interconnection device according to the present invention, by overlapping of redirected CNTs coming from vias. The arrow indicates the current flow and the circles indicate the interfaces to be crossed.
Figure 5B:
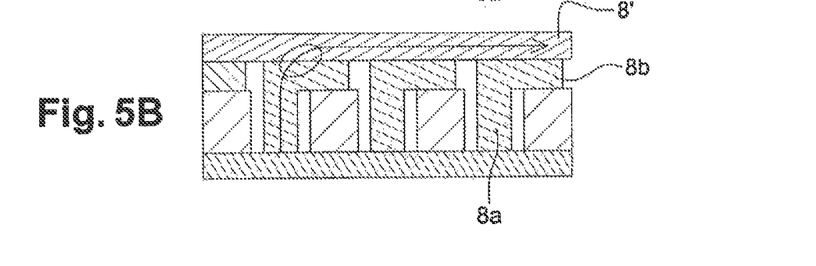
FIG. 5B is a diagram of the interconnection device according to the present invention, by connection between separate CNTs. The arrow indicates the current flow and the circles indicate the interfaces to be crossed.

The different embodiments described hereafter relate to an electronic device requiring both vertical and horizontal interconnects, thus in two different perpendicular directions, All these connections are formed by means of carbon nanotubes (CNT):

the vertical connections are formed by vertical CNT bundles which grow within vias, formed in a layer of insulating material;

the horizontal connections are also ensured by CNTs and form the connection lines. They may result from the overlapping of the bundles coming from the vias, said bundles having been redirected (first embodiment; FIG. 5A) or result from the growth of an independent bundle in lateral contact with the bundles coming from the vias, said bundles having been redirected (second embodiment; FIG. 5B).

Figure 6A:
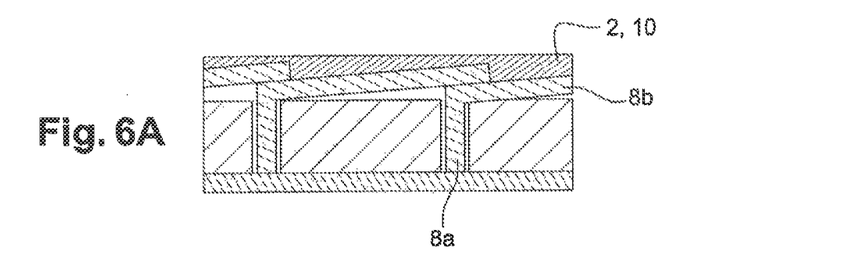
FIG. 6A is a diagram of two interconnection devices according to the invention, where the contact between CNT bundles is improved by means of a metal.
Figure 6B:
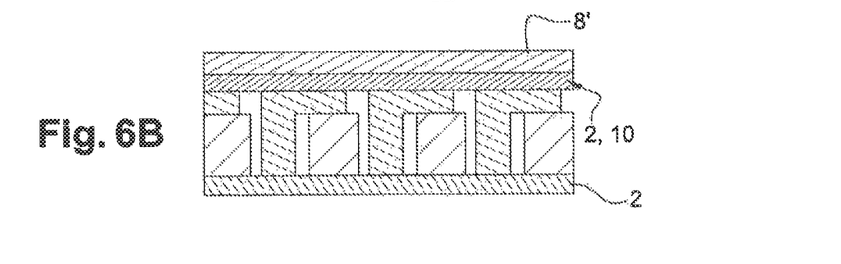
FIG. 6B is a diagram of two interconnection devices according to the invention, where the contact between CNT bundles is improved by means of a metal.
Figure 7A:
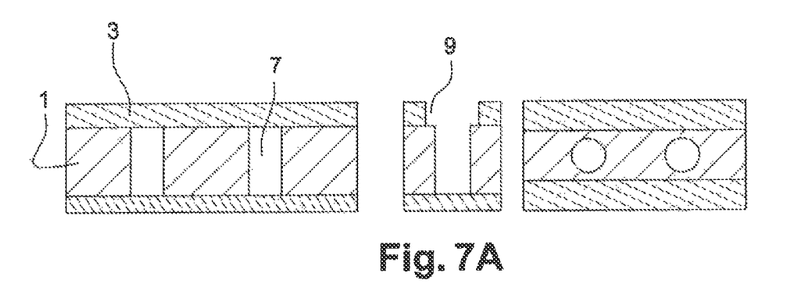
FIG. 7A is the via opening step of an embodiment of the invention according to which the vias and lines are formed simultaneously. Left-hand views: cross-section views; right-hand views: top views.
Figure 7B:
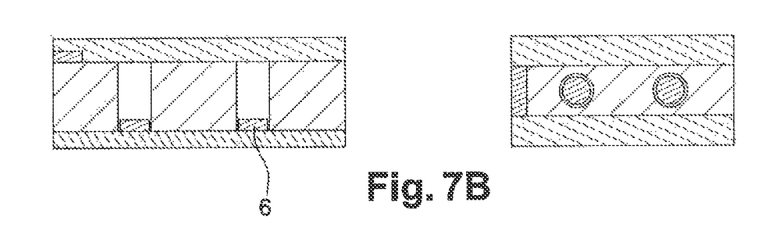
FIG. 7B is the catalyst deposition step of an embodiment of the invention according to which the vias and lines are formed simultaneously. Left-hand views: cross-section views; right-hand views: top views.
Figure 7C:
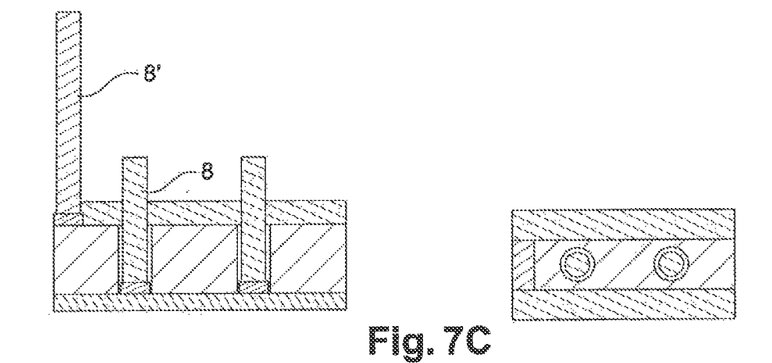
FIG. 7C is the selective nanotube growth step of an embodiment of the invention according to which the vias and lines are formed simultaneously. Left-hand views: cross-section views; right-hand views: top views.
Figure 7D:
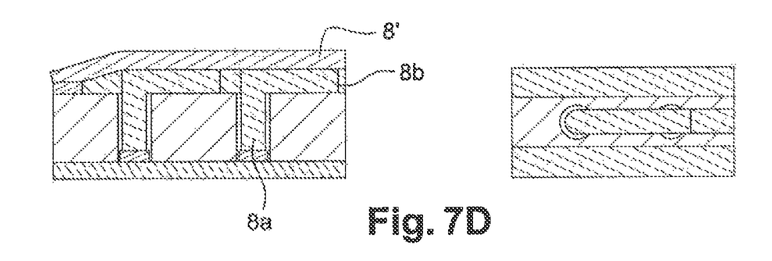
FIG. 7D is the nanotube redirection and metal deposition step of an embodiment of the invention according to which the vias and lines are formed simultaneously. Left-hand views: cross-section views; right-hand views: top views.

According to a specific embodiment, a metal layer 2, 10 is also in contact with the (Ni' bundles, especially on portions 8b of the CNT bundles (FIG. 6A and FIG. 6B).

Such a layer may advantageously be formed of;

a layer 10, for example, made of Pd or Ti, thus improving the contact of CNTs; and/or a layer 2, for example, made of Al, allowing the growth of a new CNT level, and thus of a new interconnection level.

As a variation, it may be a bilayer associating the two types of layers 10 and 2.

I/First Embodiment of the Invention

As already mentioned, this first embodiment by overlapping of vertical CNT bundles is illustrated in FIGS. 5A and 6A, respectively.

More specifically, its forming method is illustrated in FIG. 8. It should be noted that steps A to F are schematically shown in end views, that is, perpendicular to groove 3, FIGS. 8G and 8H corresponding to views parallel to the direction of groove 3.

Figure 8A:
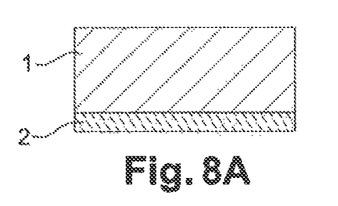
FIG. 8A is the end view of the formation of the base structure of a method for forming an interconnection device according to the present invention by CNT overlapping, perpendicular to the groove.

A/Forming of the base structure:

An insulating layer 1, made of silica or of a low-K material of microelectronics is deposited on conductive layer 2. Conductor 2 typically is aluminum.

Figure 8B:
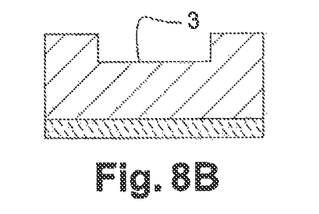
FIG. 8B is the end view of the etching step of the groove of a method for forming an interconnection device according to the present invention by CNT overlapping, perpendicular to the groove.

B/Etching of the groove:

Within insulator 1, groove 3, which will become future line 4, is formed by conventional lithography methods.

Figure 8C:
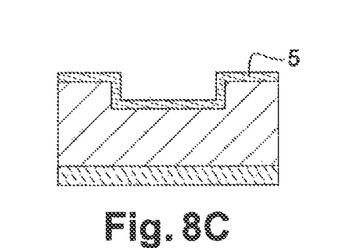
FIG. 8C is the end view of the TiN deposition step of a method for forming an interconnection device according to the present invention by CNT overlapping, perpendicular to the groove.

C/TiN deposition:

A TiN layer 5, having a thickness of approximately 50 nanometers, is deposited in groove 3, if possible by means of a conformal deposition method. TiN has the function of inhibiting the growth of carbon nanotubes when catalyst 6, here iron, is deposited on the TiN.

Figure 8D:
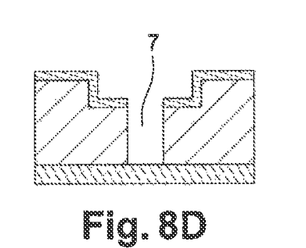
FIG. 8D is the end view of the via opening step of a method for forming an interconnection device according to the present invention by CNT overlapping, perpendicular to the groove.

D/Via opening:

Vias 7 are opened in groove 3, the etching through insulator 1 stopping on conductor 2.

Figure 8E:
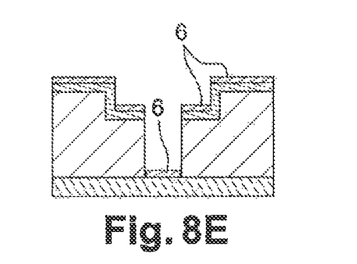
FIG. 8E is the end view of the catalyst deposition step of a method for forming an interconnection device according to the present invention by CNT overlapping, perpendicular to the groove.

E/Catalyst deposition:

The deposition of catalyst 6 is performed at ambient temperature. It typically is a layer of 1 nanometer of iron, deposited by evaporation or by ion beam sputtering. The deposition is performed with a normal incidence, to minimize the side coverage.

Figure 8F:
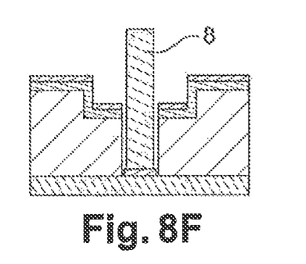
FIG. 8F is the end view of the selective nanotube growth step of a method for forming an interconnection device according to the present invention by CNT overlapping, perpendicular to the groove.

F/Selective nanotube growth:

Conventionally, carbon nanotubes (CNT) 8 are grown at 600° C., by means of a $C_2H_2+H_2+He$ mixture (10 sccm, 50 sccm, 50 sccm), after having previously oxidized the iron by means of an RF air plasma formed at ambient temperature. The plasma conditions are the following:

P=0.3 Torr;

70-W power for 30 minutes.

This method allows the growth of nanotubes 8 on iron 6, except if the latter is deposited on TiN 5. In this case, there is no growth.

The pressure during the 600° C. growth is 1 Torr. The reactive gases are introduced after the cold plasma and the temperature rise is performed within 15 minutes with a 0.3-Torr pressure.

The height of nanotubes 8 is set by the growth time.

Figure 8G:
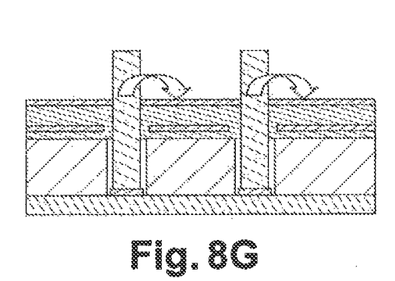
FIG. 8G is the cross-section view of the nanotube redirection step of a method for forming an interconnection device according to the present invention by CNT overlapping, perpendicular to the groove.
Figure 8H:
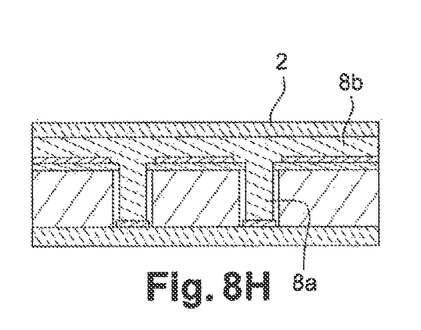
FIG. 8H is the cross-section view of the metal deposition of a method for forming an interconnection device according to the present invention by CNT overlapping, perpendicular to the groove.

G/Nanotube redirection:

After the growth, the device is immersed in isopropylic alcohol and pulled perpendicularly to the direction of groove 3: the meniscus of the liquid is perpendicular to groove 3. The liquid flowing through the groove tubes flattens tubes 8 coming from vias 7. The tubes are highly densified after this operation. Further, tubes 8 have two different portions:

a portion 8a, having an axis parallel to that of vias 7, and a portion 8b, having an axis parallel to that of groove 3.

Nanotube bundles 8, coming from the different vias 7, are thus flattened in groove 3 and come into contact. it is thus possible to form a line connection 4 by overlapping of at least two nanotube bundles coming from different vias 7.

At the end of this step, an interconnection system such as illustrated in FIG. 5A is obtained. Line 4 is formed by overlapping of nanotube bundles 8b coming from vias 7. In this embodiment, the line resistance R is formed of a series of interface resistances added to the nanotube resistance, However, in a subsequent step (FIG. 8H), it may be recommended to perform a metal deposition 2, again with aluminum, at the surface of line 4 to planarize the structure and to be able to repeat the operation (creation of interconnects) at the next level (encapsulation). At the end of this step, an interconnection system such as illustrated in FIG. 6A is obtained.

II/Second Embodiment of the Invention

This second embodiment is illustrated in FIGS. 5B, 6B, 7A-D, 9A-D, and 10A-F.

FIG. 5B illustrates the fact that the line resistance is lower than in the first embodiment since there is only one interface resistance left.

FIGS. 7A-D are drawings illustrating the principle of this second embodiment according to which the substantially perpendicular interconnects, respectively vias 7 and lines 4, come from at least two different bundles of nanotubes, advantageously formed simultaneously. it should be noted that the diagrams of the left-hand portion show cross-section views while the right-hand diagrams are top views.

Further, the embodiment implying the simultaneous growth of nanotubes 8 and 8' from line 4 and vias 7 is illustrated in FIGS. 9A-D.

The first steps are similar to those of FIGS. 8A-C.

However, before the opening of vias 7, an additional step is carried out (FIG. 9A): an opening 9 of TiN 5 is formed in groove 3, to obtain the growth of carbon nanotubes 8' in this area after deposition of catalyst 6. This corresponds to the arranging of growth area 9 of the line.

Figure 9A:
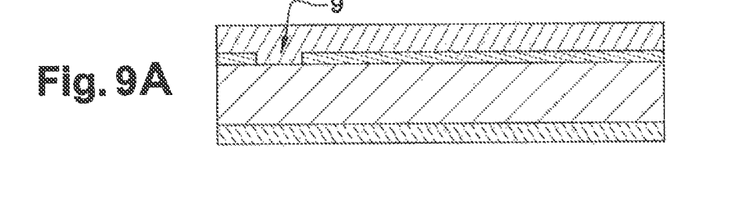
FIG. 9A is the TiN opening step of a method for forming an alternative interconnection device according to the present invention by simultaneous growth of the vias and of the line.
Figure 9B:
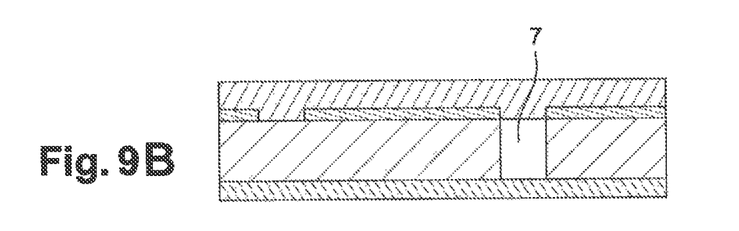
FIG. 9B is the via opening step of a method for forming an alternative interconnection device according to the present invention by simultaneous growth of the vias and of the line.
Figure 9C:
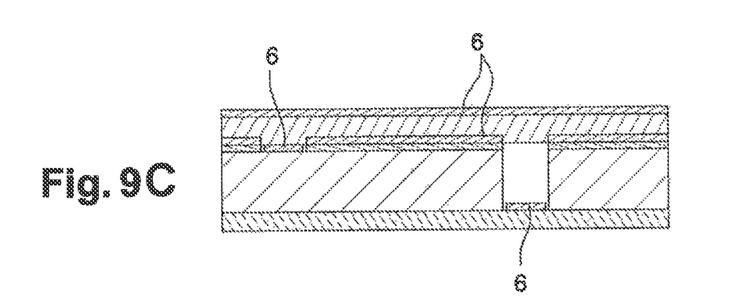
FIG. 9C is the catalyst deposition step of a method for forming an alternative interconnection device according to the present invention by simultaneous growth of the vias and of the line.
Figure 9D:
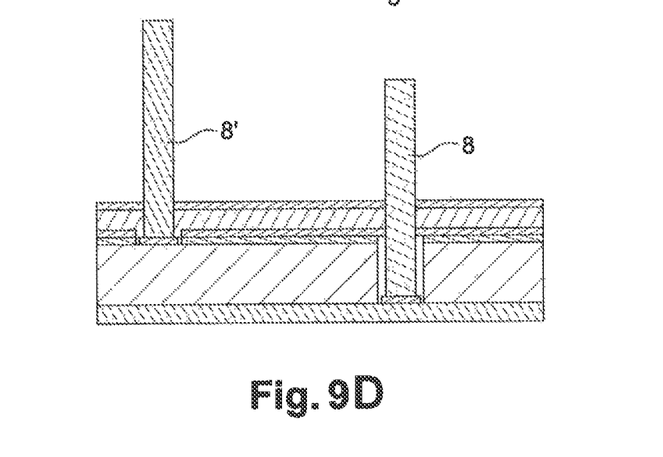
FIG. 9D is the selective nanotube growth step of a method for forming an alternative interconnection device according to the present invention by simultaneous growth of the vias and of the line.

The next step comprises openings vias 7 after having protected openings 9 with a resin layer (FIG. 9B).

After deposition of catalyst 6 (FIG. 9C) and during the growth step (FIG. 9D), tubes 8 and 8' grow in vias 7 and in growth area 9 formed at the line level, respectively. The bundles coming from CNTs 8 and 8' may he given a different length, by varying the catalyst thickness and the different plasma conditions in the vias and on the line.

After redirection of the two nanotube bundles (8, 8') coming from vias 7 and from growth area 9, respectively, the obtained interconnection system corresponds to that illustrated in FIG. 5B, It can be observed that connection line 4 is formed by means of a nanotube bundle 8' which does not come from vias 7.

Figure 10A:
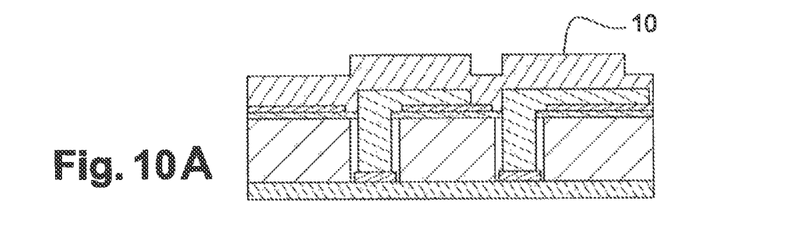
FIG. 10A is the metal deposition step of a method for forming an alternative interconnection device according to the present invention by independent growth of the vias and of the line, and insertion of a contact metal.

FIGS. 10A-F shows an embodiment where the growth of nanotubes 8 and 8' is performed separately from line 4 and vias 7, and where an interface metal 10 is inserted between the two nanotube bundles (between the CNT's, of vias 8b and the CNTs of lines 8', respectively), The method starts as in steps A to G of FIGS. 8A-G However, instead of step 8H, steps H' to M' are implemented:

H'/Deposition of a contact metal (FIG. 10A):

After redirection of nanotubes 8 coming from vias 7 (8a, 8b), contact metal 10, such as palladium, copper, gold, or titanium is deposited.

Figure 10B:
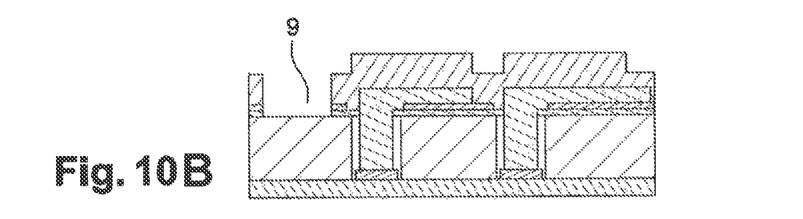
FIG. 10B is the metal opening step of a method for forming an alternative interconnection device according to the present invention by independent growth of the vias and of the line, and insertion of a contact metal.
Figure 10C:
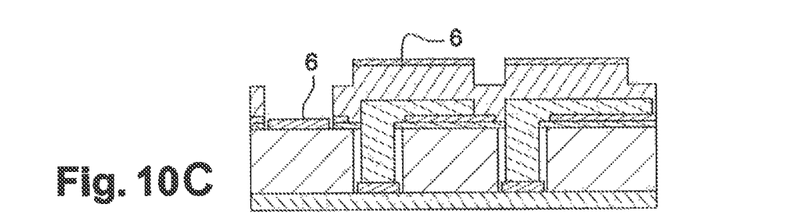
FIG. 10C is the catalyst deposition step of a method for forming an alternative interconnection device according to the present invention by independent growth of the vias and of the line, and insertion of a contact metal.

I'/Contact metal opening (FIG. 10B):

Contact metal 10 is then opened by etching at the end of groove 3 and all the way to insulator 1. Growth area 9 of the future nanotubes 8' coming from line 4 is thus formed, J'/Catalyst deposition (FIG. 10C):

The catalyst is deposited by evaporation or sputtering.

Figure 10D:
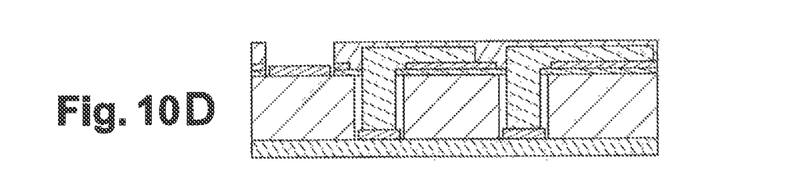
FIG. 10D is the metal planarization step of a method for forming an alternative interconnection device according to the present invention by independent growth of the vias and of the line, and insertion of a contact metal.

K'/Contact metal planarization (FIG. 10D):

The device is planarized by CMP ("Chemical and Mechanical Polishing") to suppress catalyst deposit 6 on contact metal 10, while keeping catalyst 6 in growth area 9.

Figure 10E:
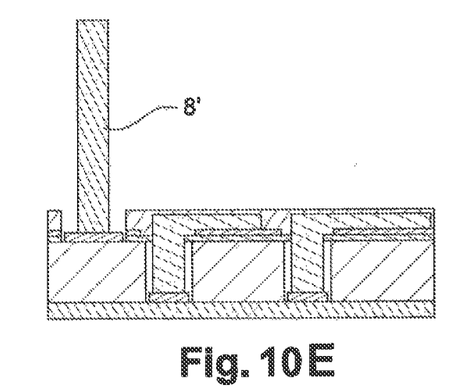
FIG. 10E is the growth step of the second nanotube of a method for forming an alternative interconnection device according to the present invention by independent growth of the vias and of the line, and insertion of a contact metal.

L'/Second nanotube growth (FIG. 10E)

A second growth in the same conditions as at step 8F is performed. The bundle of nanotubes 8' coming from growth area 9 and intended to form line 4 is thus obtained.

Figure 10F:
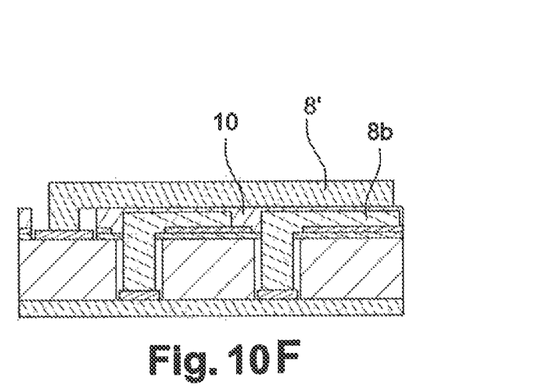
FIG. 10F is the redirection step of the second nanotube of a method for forming an alternative interconnection device according to the present invention by independent growth of the vias and of the line, and insertion of a contact metal.

M'/Line redirection (FIG. 10F):

After the growth, the nanotube bundle is redirected in the same way as at step 8G. A connection line 4 in contact via metal 10 with nanotubes 8 coming from via 7 is thus obtained.

At the end of such a process, an interconnection system such as illustrated in FIG. 6B is obtained.

The invention claimed is:

1. A method of creating electric connections extending along at least two directions of an electronic device, the method comprising:
   growing at least two carbon nanotube (CNT) bundles along a first direction in a cavity of an electronic device;
   redirecting a portion of the at least two CNT bundles along a second direction by flowing a liquid; and
   forming a connection line by connecting portions of the at least two CNT bundles redirected along the second direction.

2. The method of claim 1, wherein growing at least two CNT bundles along the first direction comprises growing each of the at least two CNT bundles along the first direction in a via, respectively, of the electronic device.

3. The method of claim 1, wherein forming a connection line comprises forming a connection line by overlapping the portions of the at least two CNT bundles redirected along the second direction.

4. The method of claim 1, wherein forming a connection line comprises forming a connection line by depositing at least one metal layer on the portions of the at least two CNT bundles redirected along the second direction.

5. The method of claim 1, comprising growing, and optionally redirecting along the second direction, another CNT bundle to connect laterally the other CNT bundle to the portion of at least one of the at least two CNT bundles redirected along the second direction, to form the connection line.

6. The method of claim 5, comprising depositing a metal layer on the other CNT bundle to connect laterally the other CNT bundle to the portion of at least one of the at least two CNT bundles redirected along the second direction.

7. The method of claim 1, comprising depositing TiN on areas where CNT bundles should not grow.

8. The method of claim 1, wherein the first direction and the second direction are substantially perpendicular.

9. The method claim 1, wherein the first direction is substantially vertical and the cavity is a via.

10. The method of claim 1, wherein the second direction is substantially horizontal.

11. The method of claim 1, wherein the connection line comprises a metal layer.

* * * * *